(12) United States Patent
Claris

(10) Patent No.: US 7,823,305 B2
(45) Date of Patent: Nov. 2, 2010

(54) MAIL PROCESSOR MACHINE CASING HAVING A DETACHABLE IDENTITY PLATE

(75) Inventor: Yannick Claris, Paris (FR)

(73) Assignee: NEOPOST Technologies, Bagneux (FR)

( * ) Notice: Subject to any disclaimer, the term of this patent is extended or adjusted under 35 U.S.C. 154(b) by 209 days.

(21) Appl. No.: 12/061,206

(22) Filed: Apr. 2, 2008

(65) Prior Publication Data

US 2008/0249962 A1      Oct. 9, 2008

(30) Foreign Application Priority Data

Apr. 5, 2007      (FR) .................................. 07 54289

(51) Int. Cl.
*G09F 3/00*      (2006.01)
*B65H 5/00*      (2006.01)

(52) U.S. Cl. ................................ 40/312; 40/913; 271/2

(58) Field of Classification Search ................... 40/909, 40/910, 674, 312, 912, 913; 177/238–243; 271/2

See application file for complete search history.

(56) References Cited

U.S. PATENT DOCUMENTS

| 4,648,548 | A | * | 3/1987 | Shin .......................... 229/116.4 |
| 5,802,754 | A | * | 9/1998 | Watanabe ..................... 40/630 |
| 2004/0003256 | A1 | | 1/2004 | Coffy et al. |

FOREIGN PATENT DOCUMENTS

| FR | 2 764 422 A1 | 12/1998 |
| FR | 2 877 472 A1 | 5/2006 |

* cited by examiner

*Primary Examiner*—Cassandra Davis
(74) *Attorney, Agent, or Firm*—Sughrue Mion, PLLC

(57) ABSTRACT

A mail processor machine casing having an identity plate for identifying the machine, which identity plate is formed by a portion of said casing that is connected to the remainder of said casing by a peripheral zone of weakness that, on being broken, makes it possible to detach said identity plate. Preferably, said zone of weakness comprises a plurality of casing bridges that can be broken by hand.

7 Claims, 1 Drawing Sheet

MAIL PROCESSOR MACHINE CASING HAVING A DETACHABLE IDENTITY PLATE

FIELD OF THE INVENTION

The present invention relates to the field of identifying mail processor machines, and it relates more particularly to a mail processor machine casing having an identity plate that is detachable so as to avoid any fraudulent trading in machines that have been decommissioned or that have come to the end of their lives.

PRIOR ART

Nowadays, mail processor machines are identified by etching markings, by sticking labels, or by affixing identity plates by means of screws, rivets, or clips onto the casings of such machines. Unfortunately, when such machines come to the end of their lives or are decommissioned for regulatory reasons, it is necessary, in order to avoid any fraud, to remove their identifiers and to inform the dealer of the machine or the postal authorities in question of that new situation. Currently, such decommissioning of the machines raises numerous problems. When the identifier is an etching, it must be erased, after reading off and recording the various identity numbers and references conveyed by the etching so as to inform the dealer of said numbers and references. Such reading-off, recording, and deleting operations are costly in terms of time and of labor. Similarly, when the identifier is a stuck-on label, it is necessary to unstick the label and then to clean the casing with alcohol. Since unsticking the label generally gives rise to destruction thereof, it is also essential, prior to such unsticking, to read off and record the various identity numbers and references conveyed by the label in order to inform the dealer of those numbers and references. Such reading-off, recording, and cleaning operations are costly in terms of time and of labor. Finally, when the identifier is an identity plate, reading-off and recording is not necessary since the plate is returned to the dealer, but it is necessary to use special tools for removing said plate, and such removal gives rise to residues, e.g. screws and rivets, that must be disposed of.

OBJECT AND DEFINITION OF THE INVENTION

An object of the present invention is to provide a mail processor machine casing having an identifier that can be removed when the machine comes to the end of its life without giving rise to pollutant residues. Another object of the invention is to enable such removal to be performed simply and at low cost in terms of labor.

These objects are achieved by a mail processor machine casing having an identity plate for identifying the machine, wherein said identity plate is formed by a portion of said casing that is connected to the remainder of said casing by a peripheral zone of weakness that, on being broken, makes it possible to detach said identity plate.

Thus, with this particular configuration, the identity plate can be detached from the casing very simply without giving rise to any pollutant residue and without using any special tools, handing the plate over to the dealer making it possible to establish the essential end-of-life history.

Advantageously, said zone of weakness comprises a plurality of casing bridges that can be broken by hand, said bridges further being formed by zones of said casing that are of smaller thickness so as to make them easier to break.

Preferably, said detachable identity plate is rectangular in shape and is connected to said remainder of said casing by at least four casing bridges.

Preferably, machine identifiers are etched onto said detachable identity plate, or are carried on a label stuck to said detachable identity plate. Advantageously, said casing and said detachable identity plate are made of a plastics material.

The invention also provides a mail processor machine having such a casing.

BRIEF DESCRIPTION OF THE DRAWING

The characteristics and advantages of the present invention appear more clearly from the following description given by way of non-limiting indication and with reference to the accompanying drawing, in which.

DETAILED DESCRIPTION OF A PREFERRED EMBODIMENT

Figure 1:
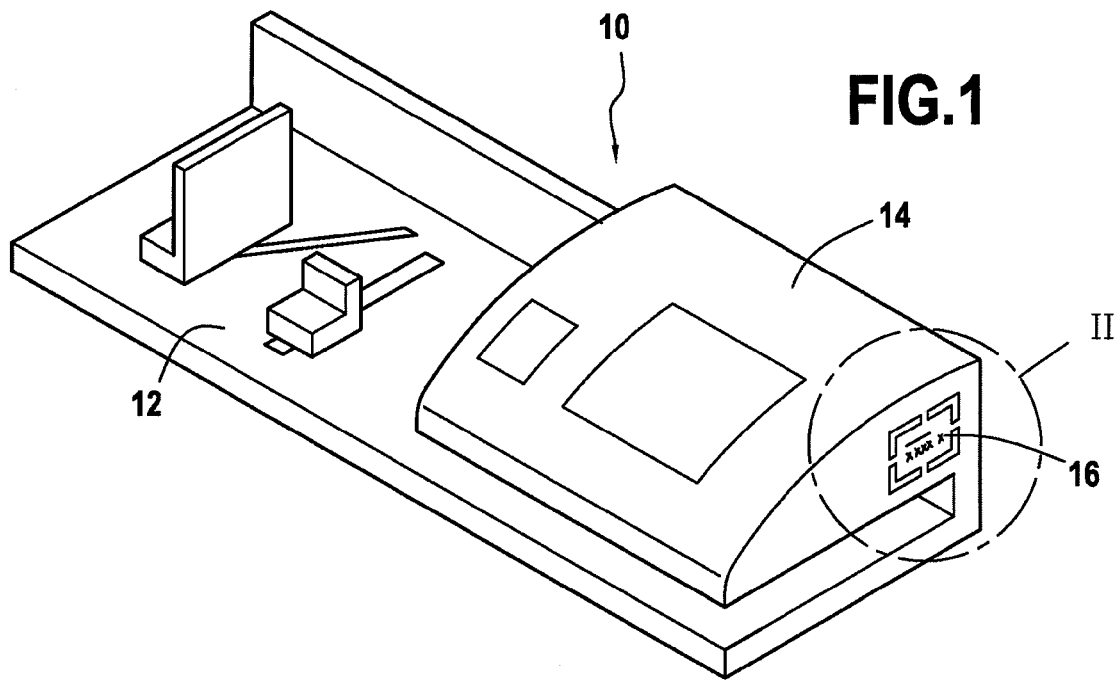
FIG. 1 is a perspective view of a mail processor machine having a casing of the invention.

A mail processor machine 10 is shown in perspective in FIG. 1. In conventional and non-limiting manner, it comprises a feed module 12 for storing a stack of mail items to be processed, followed by a module for separating the mail items one-by-one, and by a print module for printing a postage amount (i.e. for franking) the mail items separated in this way, the latter two modules conventionally being disposed in a common casing 14 provided with an identity plate 16 for identifying the machine. Said plate can be disposed on one side of the casing, as shown, on the back thereof, or indeed, on the bottom of the machine.

Figure 2:
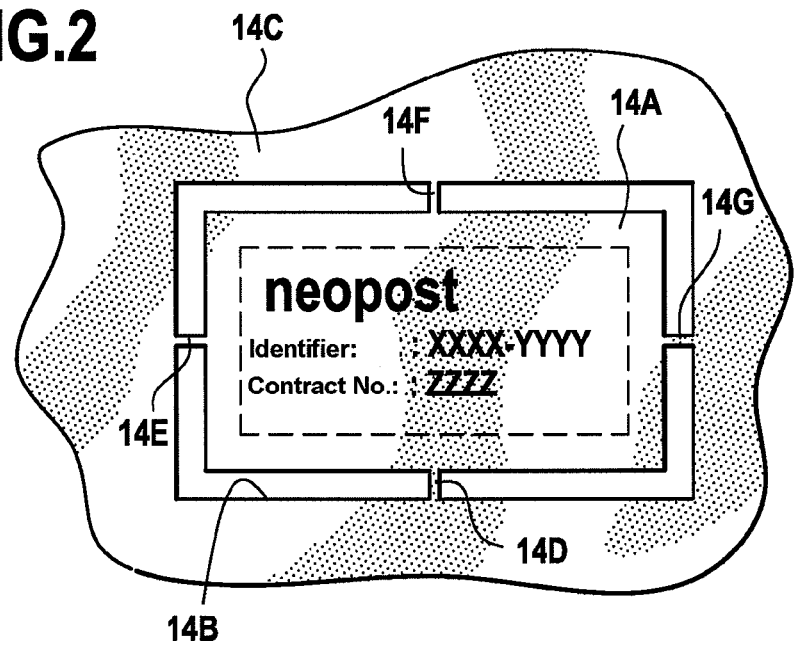
FIG. 2 is a detail view on a larger scale of one side of the casing shown in FIG. 1.

FIG. 2 shows the identity plate in detail. In accordance with the invention, it is formed of a rectangular portion of 14A of the casing, which portion is surrounded by a zone of weakness 14B that can be broken by hand to enable said portion to be detached from the remainder of the casing 14C. Preferably, said remainder of the casing is connected to the detachable identity plate by four bridges 14D, 14E, 14F, 14G. Said bridges are breakable portions of the casing that are constituted by zones of weakness of said casing that are small in width and in thickness in order to make it easy (preferably by hand) to detach the central portion 14A forming the identity plate proper on breaking said bridges. Advantageously, said plate, and indeed the entire casing, is manufactured of a plastics material. The cost and the weight of the machine are thus small.

Naturally, the shape of the identity plate and the number of bridges connecting it to the remainder of the casing are in no way limited to the example shown in FIG. 2, and a polygonal or circular shape with a plurality of uniformly distributed bridges or merely a zone of weakness of smaller thickness can naturally be imagined.

The identifiers such as a machine serial number and a contract number can be etched directly onto the central portion during manufacture of the casing, or indeed can be carried on a label (the outline of which is shown in dashed lines) that is stuck to said central portion, also during manufacture.

When the machine is taken out of service for recycling, the identity plate is detached by a technician working for the dealer who can thus incorporate the identity plate into a logistics circuit so as to enable the manufacturing site to be fully aware of which machines have come to the end of their lives. The easily detachable plate makes it possible to avoid the need to use complex tools and leaves no pollutant residue on the site of use. It is economic in terms of time and of labor. It avoids the use of metal inserts or of clip-on parts that are frequently impossible to remove for tamper-proofing reasons as is common practice in the prior art.

What is claimed is:

1. A mail processor machine comprising:
   a feed module for feeding mail items;
   a casing housing a print module for printing a postage amount on the mail items fed by the feed module, said casing having an identity plate for identifying the machine,
   wherein said identity plate is formed by a portion of said casing that is connected to the remainder of said casing by a peripheral zone of weakness that, on being broken, makes it possible to detach said identity plate.

2. A mail processor machine according to claim 1, wherein said zone of weakness comprises a plurality of casing bridges that can be broken by hand.

3. A mail processor machine according to claim 2, wherein said bridges are further formed by zones of said casing that are of smaller thickness so as to make them easier to break.

4. A mail processor machine according to claim 2, wherein said detachable identity plate is rectangular in shape and is connected to said remainder of said casing by at least four casing bridges.

5. A mail processing machine according to claim 1, wherein machine identifiers are etched onto said detachable identity plate.

6. A mail processing machine according to claim 1, wherein machine identifiers are carried on a label stuck to said detachable identity plate.

7. A mail processing machine according to claim 1, wherein said casing and said detachable identity plate are made of a plastics material.

\* \* \* \* \*